United States Patent
Hsu et al.

(10) Patent No.: US 8,845,143 B2
(45) Date of Patent: Sep. 30, 2014

(54) PHOTOELECTRONIC DEVICE

(75) Inventors: Chia-Liang Hsu, Taoyuan County (TW); Chien-Fu Huang, Chiayi (TW); Chun-Yi Wu, Taipei (TW)

(73) Assignee: Epistar Corporation, Hsinchu (TW)

( * ) Notice: Subject to any disclaimer, the term of this patent is extended or adjusted under 35 U.S.C. 154(b) by 41 days.

(21) Appl. No.: 12/289,478

(22) Filed: Oct. 29, 2008

(65) Prior Publication Data

US 2009/0109688 A1   Apr. 30, 2009

(30) Foreign Application Priority Data

Oct. 29, 2007   (TW) ................................ 96140915 A

(51) Int. Cl.
- *F21V 5/00* (2006.01)
- *H01L 33/54* (2010.01)
- *H01L 33/48* (2010.01)

(52) U.S. Cl.
CPC ............... *H01L 33/54* (2013.01); *H01L 33/483* (2013.01); *Y10S 362/80* (2013.01)
USPC ........................ 362/311.02; 362/307; 362/800

(58) Field of Classification Search
USPC .................. 362/307, 308, 296.05, 311.02
See application file for complete search history.

(56) References Cited

U.S. PATENT DOCUMENTS

| | | | |
|---|---|---|---|
| 5,026,634 A * | 6/1991 | Ono et al. ..................... 430/559 |
| 5,043,716 A * | 8/1991 | Latz et al. ...................... 345/82 |
| 6,296,376 B1 * | 10/2001 | Kondo et al. ................. 362/310 |
| 6,746,295 B2 * | 6/2004 | Sorg ............................... 445/24 |
| 6,897,488 B2 | 5/2005 | Baur et al. |
| 7,128,444 B2 * | 10/2006 | Isokawa et al. .......... 362/311.02 |
| 7,279,346 B2 * | 10/2007 | Andrews et al. ................ 438/27 |
| 7,511,313 B2 * | 3/2009 | Nakata et al. ................... 257/98 |
| 7,550,916 B2 * | 6/2009 | Harada .......................... 313/504 |
| 2003/0219919 A1 | 11/2003 | Wang et al. |
| 2006/0114678 A1 * | 6/2006 | Shimonishi et al. .......... 362/311 |
| 2006/0186431 A1 * | 8/2006 | Miki et al. ..................... 257/100 |
| 2007/0109788 A1 * | 5/2007 | Pan ............................... 362/294 |

(Continued)

FOREIGN PATENT DOCUMENTS

| | | |
|---|---|---|
| CN | 1836339 A | 9/2006 |
| CN | 101105604 A | 1/2008 |

(Continued)

OTHER PUBLICATIONS

Motlagh et al, Bahar M.; Fully Integrated 60-GHz Single-Ended Resistive Mixer in 90-nm CMOS Technology, IEEE Microwave and Wireless Components Letters, Jan. 2006, pp. 25-27; vol. 16, No. 1, IEEE.

(Continued)

*Primary Examiner* — Jong-Suk (James) Lee
*Assistant Examiner* — Leah S Macchiarolo
(74) *Attorney, Agent, or Firm* — Bacon & Thomas, PLLC

(57) ABSTRACT

A photoelectronic device including a carrier, a light-emitting component mounted on the carrier; a patterned structure deposited on the carrier and around the light-emitting component; and a transparent sealing structure formed above the light-emitting component. The patterned structure mentioned above can cause the transparent sealing structure to be focused above the light-emitting component, and restrained in the patterned structure. The transparent sealing structure with predetermined proportional configuration is obtained by controlling the quantity of the transparent sealing structure. Therefore light efficiency of the photoelectronic device can be greatly improved.

24 Claims, 7 Drawing Sheets

(56) References Cited

U.S. PATENT DOCUMENTS

| | | | | |
|---|---|---|---|---|
| 2008/0007939 | A1* | 1/2008 | Lee et al. | 362/97 |
| 2008/0013319 | A1* | 1/2008 | Pei et al. | 362/294 |
| 2008/0278655 | A1* | 11/2008 | Moon et al. | 349/58 |
| 2009/0267075 | A1* | 10/2009 | Wang et al. | 257/72 |
| 2010/0091491 | A1* | 4/2010 | Jiang et al. | 362/235 |

FOREIGN PATENT DOCUMENTS

| | | |
|---|---|---|
| CN | 101222012 A | 7/2008 |
| JP | 02413864 | 12/1990 |
| JP | 4221865 A | 8/1992 |
| JP | 2001156915 | 5/2001 |
| JP | 2001332770 A | 11/2001 |
| JP | 2002350606 A | 12/2002 |
| JP | 2006-086138 | 6/2003 |
| JP | 2004002976 | 8/2004 |
| JP | 2004266148 A | 9/2004 |
| JP | 2004338867 | 11/2004 |
| JP | 2005197509 A | 7/2005 |
| JP | 2006147999 A | 6/2006 |
| JP | 2006351809 A | 12/2006 |
| JP | 2007317952 A | 12/2007 |
| KR | 1020050042580 A | 5/2005 |
| KR | 1020060064980 | 6/2006 |
| WO | WO 2006061752 A1 * | 6/2006 |

OTHER PUBLICATIONS

Maas, Stephen A.; A GaAs MESFET Mixer with Very Low Intermodulation; , IEEE Transactions on Microwave Theory and Techniques, Apr. 1987, pp. 425-429, vol. MTT-35, No. 4, IEEE.

Gunnarsson et al, Sten E.; A 60 GHz MMIC Dual-Quadrature Mixer in pHEMT technology for Ultra Wideband IF Signals and High LO to RF Isolation; 2005, pp. 1991-1994, IEEE.

* cited by examiner

PHOTOELECTRONIC DEVICE

TECHNICAL FIELD

The present invention relates to a photoelectronic device, especially to a light-emitting device having a transparent sealing structure with predetermined dimensional configuration.

REFERENCE TO RELATED APPLICATION

This application claims the right of priority based on TW application Ser. No. 096140915, filed "Oct. 29, 2007", entitled "Photoelectronic Device" and the contents of which are incorporated herein by reference.

BACKGROUND

Light-emitting diode (LED) is of much importance in solid-state devices with a characteristic of photo-electronic conversion. Generally speaking, LED has an active layer sandwiched by two semiconductor layers with different conductivity types. When driving current is applied to electrodes above the two semiconductor layers, electrons and holes of the two semiconductor layers inject into and combine with each other in the active layer to emit light. The light is omni-directional, so it emits out from the active layer to each surface of the LED.

Meanwhile, LED is also widely used as a light source. Comparing with traditional incandescent lamp or fluorescent lamp, LED has outstanding features like efficient energy and long lifetime. Therefore, LED gradually takes the place of the traditional light sources and be widely used in a variety of fields such as traffic signals, backlight module, street lamp lighting and medical treatment devices. As the LED light sources develop and have more applications, the demand of luminance is growing higher. Hence, how to increase the light efficiency of LEDs to improve luminous thereof is an important direction for the industry to strive for.

The field worthy of studying is how to increase light efficiency by a design of sealing structure. At present a cup-like structure is generally adopted, and LED is disposed at a center of the cup to control the light distribution by taking advantage of the shapes of the cup and sealing materials. In addition, sealing materials, the reflection ability of the carrier, the shape of the cup and so on can also affect light efficiency.

In view of the foregoing, there is a need of a photoelectronic device that provides the improvement of light efficiency.

SUMMARY

In one embodiment, the present invention provides a photoelectronic device which comprises: a carrier; a light-emitting component deposited on the carrier; a patterned structure deposited on the carrier and around the light-emitting component; and a transparent sealing structure formed above the light-emitting component. The patterned structure mentioned above can restrict the transparent sealing structure to be focused in the region between the patterned structure and light-emitting component. Transparent sealing structure with predetermined dimensional configuration is produced by controlling the quantity of sealing in the transparent sealing structure. Wherein the light-emitting component can be an LED device, or any device with photo-electronic conversion characteristic.

The present invention provides a photoelectronic device which comprises: a carrier; a light-emitting component deposited on the carrier with a maximum width of z; and a transparent sealing structure formed above the light-emitting component with a height of y and a projected maximum length of x onto a surface of the carrier. Wherein the ratio of y to x is from 0.4 to 0.8, and wherein the ratio of z to x is from 0.3 to 0.5.

The present invention provides a photoelectronic device which comprises: a carrier having a protrusion portion with a bottom width of b; a light-emitting component connected to top of the protrusion portion with a maximum width of a; and a transparent sealing structure covering the protrusion portion and light-emitting component with a length of c. Wherein the light-emitting component is deposed proximately to a position of c/2, and a ratio of a to b is less than or equal to 3. The transparent sealing structures with various predetermined dimensional configuration of the present invention can improve the light efficiency of the light-emitting component.

Broadly speaking, the present invention fulfills the need by providing an improved photoelectronic device to increase light efficiency. It should be appreciated that the present invention can be implemented in numerous ways, including as a process, an apparatus or a system. Several inventive embodiments of the present invention are described below.

DETAILED DESCRIPTION

Several exemplary embodiments for an improved photoelectronic device is now described. It is apparent to those skilled in the art that the present invention may be practiced without some or all of the specific details set forth herein. It is also apparent to those skilled in the art that the present invention may be practiced for backlight module or lighting device.

Figure 1:
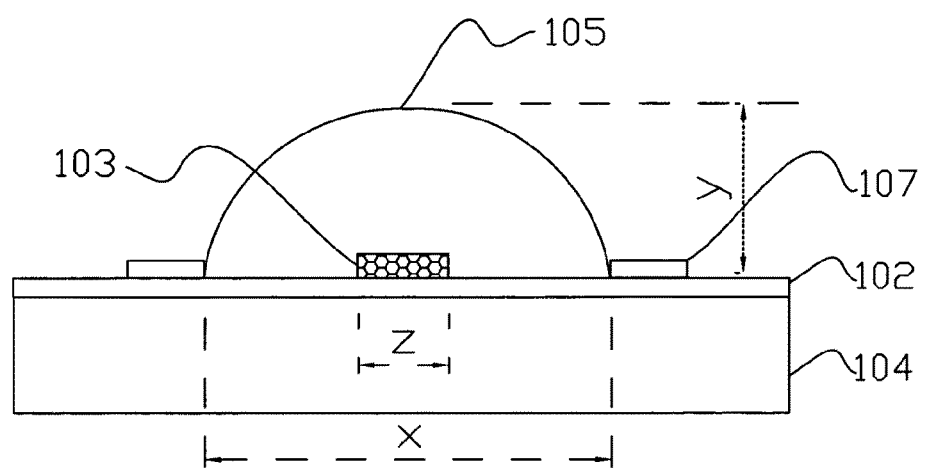
FIG. 1 shows a schematic view of the photoelectronic device of a first embodiment.

FIG. 1 shows a schematic view of the photoelectronic device of a first embodiment, wherein structural elements that each reference numeral designates is described as follow: 104 for a carrier, 102 for a reflective layer, 103 for a light-emitting component, 105 for a transparent sealing structure, and 107 for a patterned structure. It should be appreciated that like structural elements in other figures hereinafter are designated by like reference numerals, and will not describe below.

Referring to FIG. 1, the photoelectronic device of the embodiment is essentially formed as below: firstly, forming a reflective layer 102 with high reflectivity onto a surface of a flat carrier 104; and then forming a light-emitting component 103 onto the reflective layer 102; after that, spreading a layer of patterned structure 107 with hydrophobic property around the light-emitting component 103 to form a pattern like circular, rectangle or square. Afterwards, a transparent sealing material is formed above the light-emitting component 103 by an adhesive dispensing technique. The patterned structure 107 with hydrophobic property can make the transparent sealing material restrained to a range between the patterned structure 107 and the light-emitting component 103. Simultaneously, during adhesive dispensing, as shown in FIG. 1, transparent sealing structure 105 with protrusion is produced by controlling the quantity of the transparent sealing material. The photoelectronic device produced by the steps aforementioned can make the light of the light-emitting component 103 emitting from the transparent sealing structure 105 after being reflected by the reflective layer 102. Light efficiency can be greatly improved by the design of the reflective layer 102 and the transparent sealing structure 105.

Wherein, the maximum width of the light-emitting component 103 is z, the height of the transparent sealing structure 105 is y, and the maximum length of a contact area between the transparent sealing structure 105 and the reflective layer 102 is x. When a ratio of y to x is from 0.4 to 0.8, light efficiency is much higher, and preferably to be 0.6. In the meantime, when a ratio of z to x is from 0.3 to 0.5, better light efficiency could also be obtained, and preferably to be 0.4.

The carrier 104 could be a printed circuit board (PCB), flexible printed circuit board (FPCB), ceramic substrate or composite substrate. Besides supporting the light-emitting component 103, the carrier 104 further dissipates heat produced by the light-emitting component 103 and therefore achieving heat dissipation. The reflective layer 102 has high reflection coefficient, and can be made of Au, Ag, Al, Cu or alloys of a combination of the above, and can also be made of a polymer material with reflective property. The color of light emitted from the light-emitting component 103 could be red, blue, green, yellow, etc. The patterned structure 107 is made of materials with hydrophobic property. Surface tension may exist between such materials and the transparent sealing material which makes the transparent sealing material focus in a region between the patterned structure 107 and the light-emitting component 103, therefore generating a protuberant transparent sealing structure 105. Wherein the patterned structure 107 could be a polymer material with hydrophobic functional group, such as methyl group or fluorine group. The fabrication of the patterned structure 107 is as below: producing the polymer material by sol-gel method or polymerization method, and then forming predetermined patterns such as circular, rectangle or square on a surface of the carrier 104 by screen printing process, inject printing process, etc. The transparent sealing structure 105 is produced by forming a transparent sealing material above the light-emitting component 103 by adhesive dispensing technique, and then heating for curing. The transparent sealing material can be an organic insulating material with high light transmitting property, such as epoxy, poly-imides, silicon resin or a mixture of the above mentioned materials.

Figure 2:
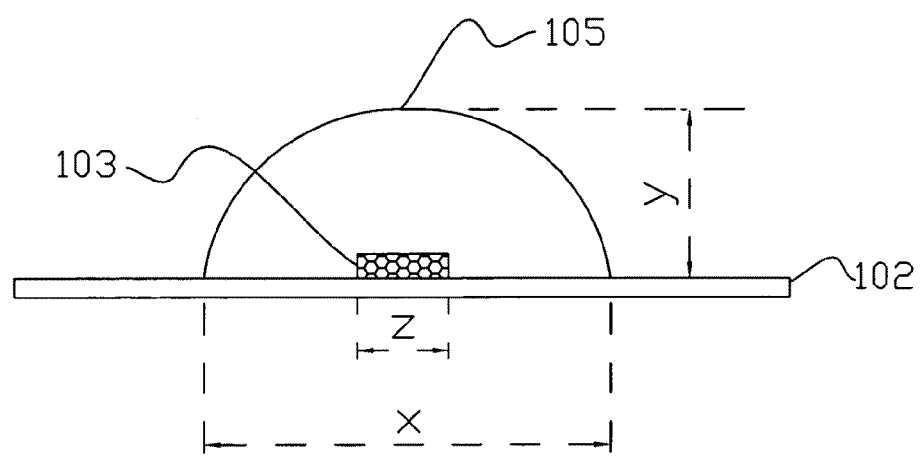
FIG. 2 shows a schematic view of the photoelectronic device of a second embodiment.
Figure 4A:
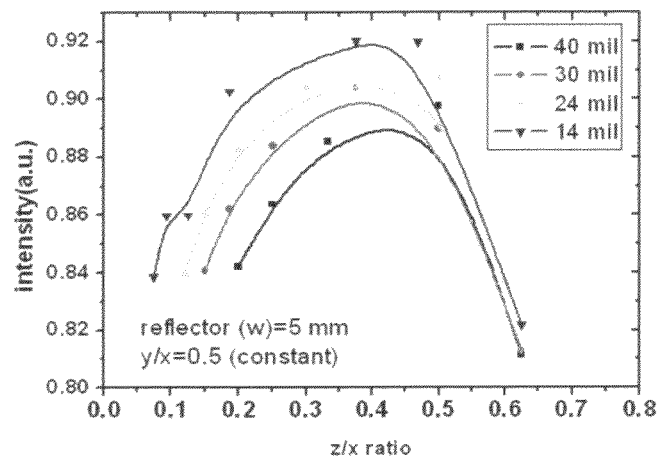
FIG. 4A shows a graph of a relation between light efficiency and ratio of y to x.
Figure 4B:
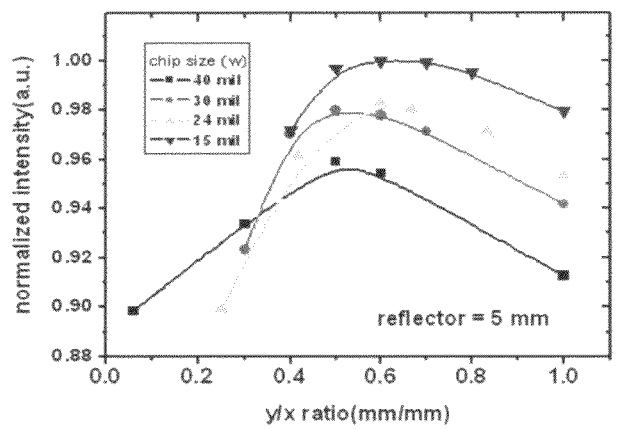
FIG. 4B shows a graph of a relation between light efficiency and ratio of z to x.

FIG. 2 shows a photoelectronic device of a second embodiment. As described in the first embodiment, after forming a reflective layer 102 with high reflectivity, light-emitting component 103 is formed above the reflective layer 102. Afterwards, transparent sealing material is dispensed above the light-emitting component 103 by adhesive dispensing technique. The transparent sealing structure 105 with particular protrusion shape is produced by controlling the quantity of the transparent sealing material. To obtain optimal light efficiency, the shape of the transparent sealing structure 105 must be deliberately designed. Referring to FIG. 2, the maximum width of the light-emitting component 103 is z, the height of the transparent sealing structure 105 is y, the maximum length of the contact surface between the transparent sealing structure 105 and the reflective layer 102 is x. The light-emitting component 103 could be a commonly known chip with a size of 15 to 40 mils. By tuning the adhesive dispensing condition; a variety of protrusion shape of the transparent sealing structure 105 is formed above the light-emitting component 103, so as to obtain light efficiencies at different ratio of y to x. Taking the two, i.e., the light efficiencies and the ratio of y to x, as the coordinates to plot a relationship graph as shown in FIG. 4A. Referring to FIG. 4A, when the ratio of y to x is from 0.4 to 0.8, the light efficiency is much higher; preferably when the ratio of y to x is near 0.6, the light efficiency is the highest. Moreover, when the ratio of y to x of the transparent sealing structure 105 is fixed in 0.5, the light efficiency is measured with different ratios of z to x, and then take the two, i.e., the light efficiency and the ratio of z to x, as the coordinates to plot a relationship graph as shown in FIG. 4B. When the ratio of z to x is from 0.3 to 0.5, the light efficiency is much higher; preferably when the ratio of z to x is near 0.4, the light efficiency is highest.

Figure 3:
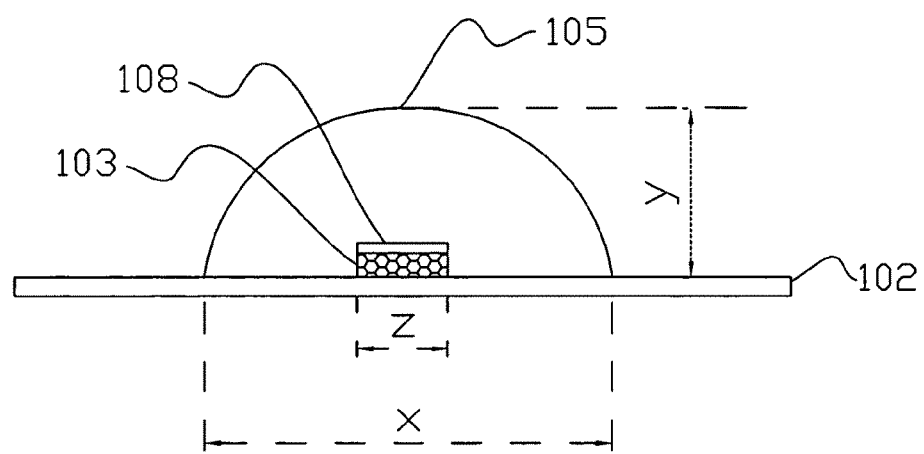
FIG. 3 shows a schematic view of the photoelectronic device of a third embodiment.

FIG. 3 shows a photoelectronic device of a third embodiment, further comprises a fluorescent powder layer 108 spreading onto the surface of the light-emitting component 103 to convert wavelength. The light-emitting component 103 can be an InGaN series light emitting diode which is capable of emitting blue light, and generating white light by exciting an YGA series yellow fluorescent powder layer 108.

Figure 5:
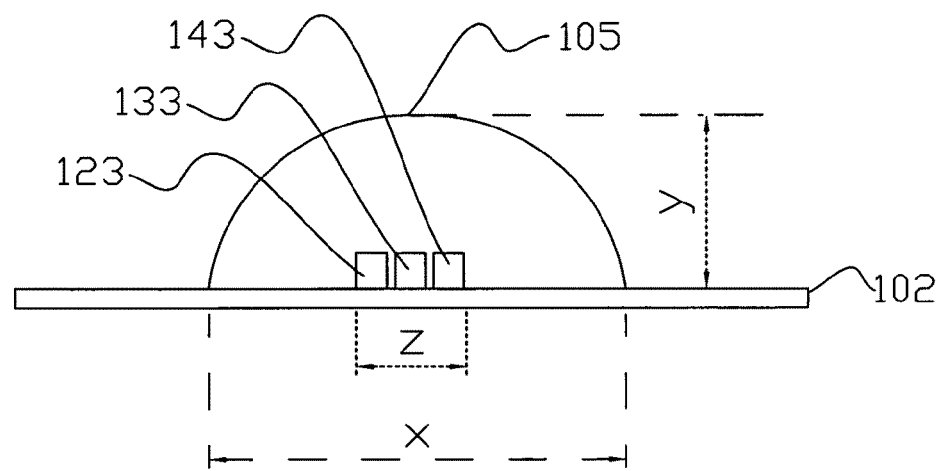
FIG. 5 shows a schematic view of the photoelectronic device of a fourth embodiment.

A fourth embodiment of the present invention is shown in FIG. 5. Comparing with the second embodiment, a plurality of light-emitting elements 123, 133 and 143 take place of the light-emitting component 103 in the second embodiment, wherein the light-emitting elements 123, 133 and 143 emit different colored lights such as red, green and blue respectively. The lights aforementioned are mixed in the transparent sealing structure 105 to produce white light. As is shown, the maximum width of the series made up by the plurality of light-emitting elements 123, 133 and 143 is z, the height of the transparent sealing structure 105 is y, the maximum length of the contact surface between the transparent sealing structure 105 and the reflective layer 102 is x. A ratio of y to x is from 0.4 to 0.8, preferably 0.6, and a ratio of z to x is from 0.3 to 0.5, preferably 0.4.

Figure 6:
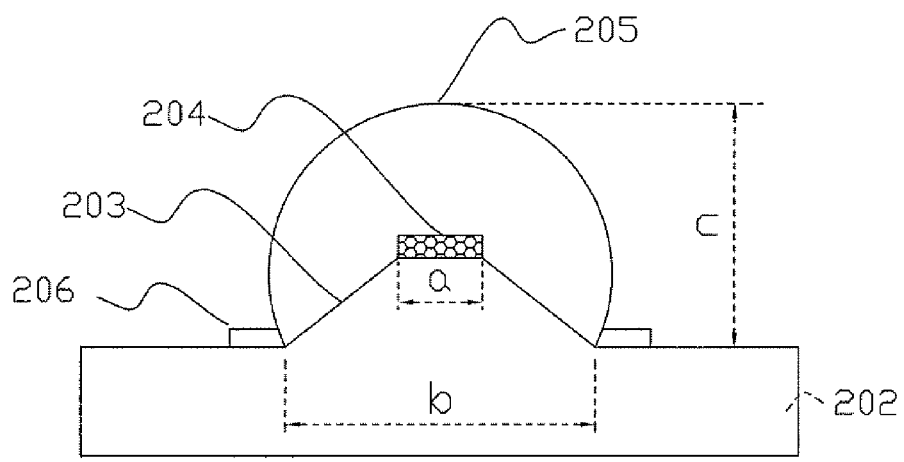
FIG. 6 shows a schematic view of the photoelectronic device of a fifth embodiment.

A fifth embodiment of the present invention is shown in FIG. 6, which is a bulb-like photoelectronic device, comprising a carrier 202 with protrusion portion 203; a light-emitting component 204 formed above the protrusion portion 203; and a transparent sealing structure 205 covering the protrusion portion 203 and the light-emitting component 204. Wherein the width of the light-emitting component 204 is a, the bottom width of the protrusion portion 203 is b, and the height of the transparent sealing structure 205 is c. To improve light efficiency of the bulb-like photoelectronic device, a ratio between the width of the light-emitting component 204 and the bottom width of the protrusion portion 203 is a to b, preferably less than or equal to 3. The light-emitting component 204 is located proximately to the position of c/2. Moreover, the light-emitting component 204 can be placed by a plurality of light-emitting elements with different colors, such as by white light source consisted by red, green, and blue light. Simultaneously, a patterned structure 206 is also formed near the bottom of the protrusion portion 203, which restricts the transparent sealing structure 205 above the protrusion portion 203, therefore obtain a near circular sphere.

Figure 7:
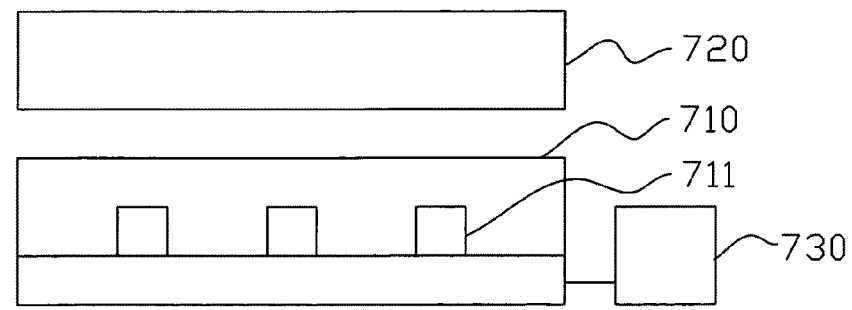
FIG. 7 shows a schematic view of a backlight module of the present invention.

FIG. 7 shows a backlight module, wherein the backlight module 700 comprises a light source device 710 constituted by photoelectronic device 711 described in any embodiment above; an optical device 720 placed at emission path of the light source device 710 for processing the light emitted from the light source device 710; and a power supply system 730 to provide power needed by the light source device 710.

Figure 8:
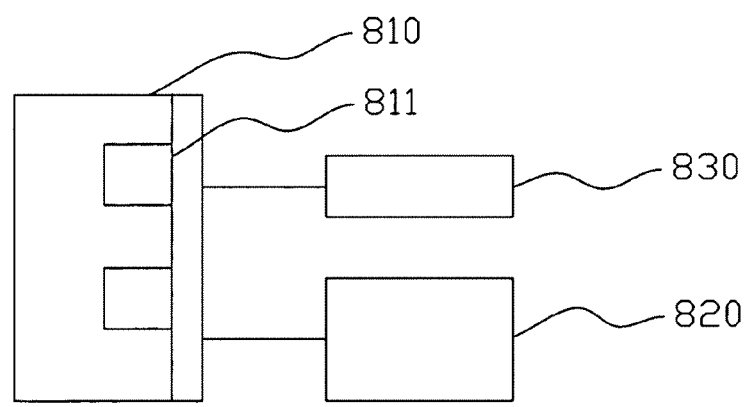
FIG. 8 shows a schematic view of a lighting device of the present invention.

FIG. 8 shows a lighting device 800, which could be car lamp, streetlamp, flashlight, road lamp and indicator lamp etc. Wherein the lighting device 800 comprises a light source device 810 constituted by photoelectronic device 811 as described in above embodiments; a power supply system 820 to provide power needed by the light source device 810; and a control element 830 used to control input current to the light source device 810.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A photoelectronic device, comprising:
a carrier comprising a flat surface;
a light-emitting component disposed on the flat surface;
a patterned structure which is made of a material with hydrophobic property disposed on the flat surface and around the light-emitting component, wherein the patterned structure has a top surface; and
a transparent sealing structure of a cured transparent sealing material formed above the light-emitting component, and located between the patterned structure and the light-emitting component;
wherein the patterned structure restrains the transparent sealing structure to a range between the patterned structure, and the transparent sealing structure exposes the top surface of the patterned structure;
wherein the light-emitting component has a maximum width of z; the transparent sealing structure has a height of y and a projected maximum length of x onto the flat surface; and wherein a ratio of y to x is from 0.4 to 0.8; and a ratio of z to x is 0.3 to 0.5; and
wherein the transparent sealing structure is not overlapped with the patterned structure from the top view.

2. The photoelectronic device as claimed in claim 1, wherein the transparent sealing material comprises epoxy, poly-imides, silicon resin or a mixture thereof.

3. The photoelectronic device as claimed in claim 1, wherein the transparent sealing structure is protuberant from the flat surface.

4. The photoelectronic device as claimed in claim 1, wherein the material with hydrophobic property is a polymer material with a functional group of methyl or fluorine.

5. The photoelectronic device as claimed in claim 1, further comprising a fluorescent powder layer covered on the light-emitting component.

6. The photoelectronic device as claimed in claim 1, further comprising a reflective layer positioned between the carrier and the light-emitting component.

7. A backlight module comprising:
a light source device comprising the photoelectronic device of claim 1;
an optical device at an emission path of the light source device; and
a power supply system.

8. A lighting device comprising:
a light source device comprising the photoelectronic device of claim 1;
a power supply system; and
a control element.

9. The photoelectronic device as claimed in claim 1, wherein the light-emitting component separates from the patterned structure from a top view.

10. A photoelectronic device, comprising;
a carrier, having a protrusion portion with a bottom width of b, wherein the protrusion portion comprises an upper surface and a lower surface lower than the upper surface;
a patterned structure having a top surface, formed on the bottom surface and disposed on the carrier;
a light-emitting component with a maximum width of a, formed on the upper surface; and
a transparent sealing structure of a cured transparent sealing material with a shape of circular sphere and with a height of c, covering the protrusion portion and the light-emitting component, and exposing the top surface of the patterned structure;
wherein the patterned structure restricts the transparent sealing structure above the protrusion portion; and
wherein a ratio of the maximum width of the light-emitting component to the bottom width of the protrusion portion is from 0.3 to 0.5; and
wherein the transparent sealing structure is not overlapped with the patterned structure from the top view.

11. The photoelectronic device as claimed in claim 10, wherein a ratio of a to b is less than or equal to 3.

12. The photoelectronic device as claimed in claim 10, wherein the light-emitting component is replaced by a plurality of light-emitting elements with different colors.

13. The photoelectronic device as claimed in claim 10, further comprising a patterned structure formed adjacent to the bottom of the protrusion portion.

14. The photoelectronic device as claimed in claim 10, wherein the light-emitting component is located at a height of approximately c/2.

15. A backlight module comprising:
a light source device comprising the photoelectronic device of claim 10;
an optical device at an emission path of the light source device; and
a power supply system.

16. A lighting device comprising:
a light source device comprising the photoelectronic device of claim 10;
a power supply system; and a control element.

17. The photoelectronic device as claimed in claim 10, wherein a ratio of the height of the circular transparent sealing structure to the bottom width of the protrusion portion is about 0.6.

18. The photoelectronic device as claimed in claim 10, wherein a ratio of the maximum width of the light-emitting component to the bottom width of the protrusion portion is about 0.4.

19. The photoelectronic device as claimed in claim 10, further comprising a fluorescent powder layer covered on the light-emitting component.

20. The photoelectronic device as claimed in claim 10, further comprising a reflective layer located under the light-emitting component.

21. The photoelectronic device as claimed in claim 10, wherein the patterned structure is disposed on the carrier and around the light-emitting component.

22. The photoelectronic device as claimed in claim 10, wherein the light-emitting component comprises a plurality of light-emitting elements, wherein the maximum width of "a" refers to a maximum width of a series made up by the plurality of light-emitting elements.

23. The photoelectronic device as claimed in claim 10, wherein the transparent sealing material comprises epoxy, poly-imides, silicon resin or a mixture thereof.

24. The photoelectronic device as claimed in claim 10, wherein the light-emitting component separates from the patterned structure from a top view.

* * * * *